(12) United States Patent
Orlowski et al.

(10) Patent No.: US 7,456,055 B2
(45) Date of Patent: Nov. 25, 2008

(54) PROCESS FOR FORMING AN ELECTRONIC DEVICE INCLUDING SEMICONDUCTOR FINS

(75) Inventors: Marius K. Orlowski, Austin, TX (US); Suresh Venkatesan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 190 days.

(21) Appl. No.: 11/375,890

(22) Filed: Mar. 15, 2006

(65) Prior Publication Data

US 2007/0218628 A1    Sep. 20, 2007

(51) Int. Cl.
*H01L 21/00* (2006.01)

(52) U.S. Cl. ............... 438/157; 438/197; 438/198; 438/199; 257/351; 257/401; 257/E27.108; 257/E29.137

(58) Field of Classification Search ........... 438/254, 438/157, 197, 198, 199; 257/351, 401, E27.108, 257/E29.137
See application file for complete search history.

(56) References Cited

U.S. PATENT DOCUMENTS

| | | | |
|---|---|---|---|
| 5,384,473 | A | 1/1995 | Yoshikawa et al. |
| 6,720,619 | B1 | 4/2004 | Chen et al. |
| 6,867,433 | B2 | 3/2005 | Yeo et al. |
| 6,909,147 | B2 | 6/2005 | Aller et al. |
| 6,911,383 | B2 | 6/2005 | Doris et al. |
| 7,211,474 | B2 | 5/2007 | Cheng et al. |
| 2003/0042531 | A1* | 3/2003 | Lee et al. ............ 257/315 |
| 2004/0031979 | A1 | 2/2004 | Lochtefeld et al. |
| 2004/0222477 | A1 | 11/2004 | Aller et al. |
| 2004/0259324 | A1 | 12/2004 | Brask et al. |
| 2004/0266076 | A1 | 12/2004 | Doris et al. |
| 2005/0023633 | A1 | 2/2005 | Yeo et al. |
| 2005/0101072 | A1* | 5/2005 | Bryant et al. ............ 438/151 |
| 2005/0116289 | A1 | 6/2005 | Boyd et al. |

(Continued)

FOREIGN PATENT DOCUMENTS

| | | |
|---|---|---|
| EP | 1 519 421 A1 | 3/2005 |
| WO | 2007130728 A2 | 11/2007 |

OTHER PUBLICATIONS

Yang et al., "On the Integration of CMOS with Hybrid Crystal Orientations," IBM Semiconductor Research and Development Center, 2004 Symposium on VLSI Technology Digest of Technical Papers, 2004 IEEE, pp. 160-161.

(Continued)

*Primary Examiner*—Brook Kebede
*Assistant Examiner*—Tony Tran (57) ABSTRACT

An electronic device can include a base layer, a semiconductor layer, and a first semiconductor fin spaced apart from and overlying a semiconductor layer. In a particular embodiment, a second semiconductor fin can include a portion of the semiconductor layer. In another aspect, a process of forming an electronic device can include providing a workpiece that includes a base layer, a first semiconductor layer that overlies and is spaced apart from a base layer, a second semiconductor layer that overlies, and an insulating layer lying between the first semiconductor layer and the second semiconductor layer. The process can also include removing a portion of the second semiconductor layer to form a first semiconductor fin, and forming a conductive member overlying the first semiconductor fin.

19 Claims, 8 Drawing Sheets

U.S. PATENT DOCUMENTS

| | | |
|---|---|---|
| 2005/0118826 A1 | 6/2005 | Boyd et al. |
| 2005/0181612 A1 | 8/2005 | Brask et al. |
| 2005/0275018 A1 | 12/2005 | Venkatesan et al. |
| 2006/0194384 A1 | 8/2006 | Venkatesan et al. |
| 2006/0292770 A1* | 12/2006 | Wu et al. ............... 438/187 |
| 2007/0218628 A1 | 9/2007 | Orlowski et al. |

OTHER PUBLICATIONS

Doris et al., "A Simplified Hybrid Orientation Technology (SHOT) for High Performance CMOS," IBM Semiconductor Research and Development Center, 2004 Symposium on VLSI Technology Digest of Technical Papers, 2004 IEEE, pp. 86-87.

U.S. Appl. No. 11/328,668, entitled: Process for Forming an Electronic Device Including a Fin-Type Structure, filed Jan. 10, 2006.

U.S. Appl. No. 11/337,355, entitled: Electronic Device Including a Static-Random-Access Memory Cell and A Process of Forming the Electronic Device, filed Jan. 23, 2006.

Actions on the Merits by the U.S.P.T.O. as of Nov. 28, 2007, 1 page.

U.S. Appl. No. 11/375,893, Notice of Allowance mailed Apr. 25, 2008.

* cited by examiner

PROCESS FOR FORMING AN ELECTRONIC DEVICE INCLUDING SEMICONDUCTOR FINS

BACKGROUND

1. Field of the Disclosure

The present disclosure relates to electronic devices, more particularly, to electronic devices including semiconductor fins and processes for forming the electronic devices.

2. Description of the Related Art

An electronic device can have a semiconductor fin that can act as a part of an electronic component, such as a transistor, a resistor, a capacitor, or any combination thereof. A device design can include channel regions of both conductivity types, fin and planar component structures, fins of more than one height, or any combination thereof within the same electronic device. Carrier mobility within a channel region can be affected by adjusting materials characteristics of the semiconductor material such as dopant type, dopant concentration, crystal orientation, intrinsic stress, or any combination thereof. Formation of areas with substantially different materials characteristics at specific transistor locations on a substrate can add complexity and expense to the manufacturing process. Such transistor locations can vary widely from mask set to mask set complicating the process of purchasing pre-formed or predefined substrates.

One proposed approach is to use additional processing and selectively thin a semiconductor region, such that a relatively shorter semiconductor-fin can be formed in the thinner semiconductor region and a relatively taller semiconductor fin can be formed in another semiconductor region. However, this does not address the need for materials differences without the addition of considerable complexity to the manufacturing process.

A double semiconductor-on-insulator (SOI) substrate has been proposed for planar devices, the double SOI substrate including a first semiconductor layer and a second semiconductor layer, wherein the first semiconductor layer overlies a base layer, and the second semiconductor layer overlies the first semiconductor layer. A first insulating layer can lie between the base layer and the first semiconductor, and a second insulating layer can lie between the first and the second semiconductor layers. The double SOI substrate can address the issues with carrier mobility in the channel region. However, the thickness of each of the first and second semiconductor layers can be the full height of the tallest structure formed from that layer. The top surface of a channel region formed from the first semiconductor layer can be separated in elevation from the top surface of a channel region formed from the second semiconductor layer by the combined thickness of the second semiconductor layer and the second insulating layer. Such a difference in elevation can be problematic for integration with lithography and planarization processes.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

An electronic device can include a base layer, a semiconductor layer, and a first semiconductor fin, wherein the semiconductor layer overlies and is spaced apart from the base layer, and the first semiconductor fin overlies and is spaced apart from the semiconductor layer. In one embodiment, the electronic device can also include a second semiconductor fin overlying and spaced apart from the base layer, wherein the second semiconductor fin comprises a portion of the semiconductor layer. In another aspect, an electronic device can include a base layer, a semiconductor layer, and a first semiconductor fin spaced apart from and overlying a semiconductor layer. In a particular embodiment, a second semiconductor fin can include a portion of the semiconductor layer.

In a further aspect, a process of forming an electronic device can include providing a workpiece that includes a base layer, a first semiconductor layer that overlies and is spaced apart from a base layer, a second semiconductor layer that overlies, and an insulating layer lying between the first semiconductor layer and the second semiconductor layer. The process can also include removing a portion of the second semiconductor layer to form a first semiconductor fin, and forming a conductive member overlying the first semiconductor fin. Specific embodiments of the present disclosure will be better understood with reference to the description that follows.

Some terms are defined or clarified as to their intended meaning as they are used within this specification. Unless stated otherwise, strain of a layer is measured at room temperature (approximately 25° C.) after formation of the layer and before a subsequent heat cycle that is greater than 100° C.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

Figure 1:
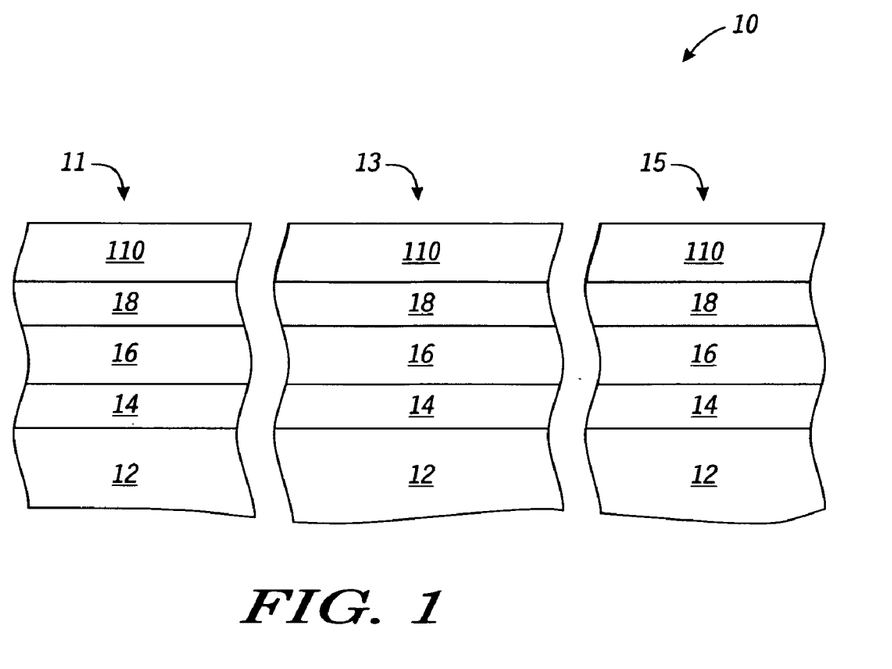
FIG. 1 includes an illustration of a cross-sectional view of a first location, a second location, and a third location of a workpiece with two buried insulating layers.

FIG. 1 includes a cross-sectional view of an illustration of a portion of a workpiece 10 at locations 11, 13, and 15 where electronic components can be formed. In the illustrated embodiment, the workpiece 10 can include a base layer 12 and semiconductor layers 16 and 110, each spaced apart from each other by insulating layers 14 and 18. In one embodiment, the base layer 12 can be a support layer and comprise a material capable of providing mechanical support for the other layers. In the illustrated embodiment the base layer 12 can also act as a bulk semiconductor portion of an electronic component and can include a semiconductor element such as silicon, germanium, carbon, another semiconductor element, or any combination thereof. The base layer 12 may include n-type, p-type or a combination of n-type and p-type dopant. In one embodiment the base layer 12 can have a major surface along a (100) or a (110) crystal plane. In another embodiment, the base layer 12 can include a quartz or plastic plate.

The insulating layer 14 can be a buried insulating layer and can lie between, and provide electrical insulation between, the base layer 12 and the semiconductor layer 16. The insulating layer 14 can be formed by a conventional or proprietary deposition or growth process. The insulating layer 14 can be an oxide, a nitride, an oxynitride, or any combination thereof. The insulating layer 14 can have a thickness in a range of approximately 30 to approximately 150 nm. In other embodiments, the insulating layer 14 can be thicker.

The semiconductor layer 16 can be formed by a conventional or proprietary deposition or growth process using a semiconductor material described in any embodiment with respect to the base layer 12. The semiconductor layer 16 can comprise the same or a different material, the same or a different dopant, the same or a different dopant concentration, the same or a different strain, the same or a different crystal orientation, or any combination thereof as compared to the base layer 12. The thickness of the semiconductor layer 16 can be in a range of approximately 30 to approximately 150 nm. The insulating layer 18 can be formed by any embodiment described with respect to the insulating layer 14. The insulating layer 18 can be the same or different material or the same or different thickness as compared to the insulating layer 14. The semiconductor layer 110 can be formed by an embodiment previously described with respect to the semiconductor layer 16. The semiconductor layer 110 can be the same or a different material, the same or a different dopant, the same or a different dopant concentration, the same or a different strain, the same or a different crystal orientation, or any combination thereof as compared to the semiconductor layer 16. The thickness of the semiconductor layer 110 can be the same or different thickness as compared to the semiconductor layer 16. In one embodiment, the semiconductor layers 16 and 110, the insulating layers 14 and 18, and the base layer 12 can comprise a double semiconductor-on-insulator ("SOI") substrate. In another embodiment (not illustrated), one or more additional protective layers can be formed overlying the semiconductor layer 110 to aid in the manufacturing process.

Figure 2:
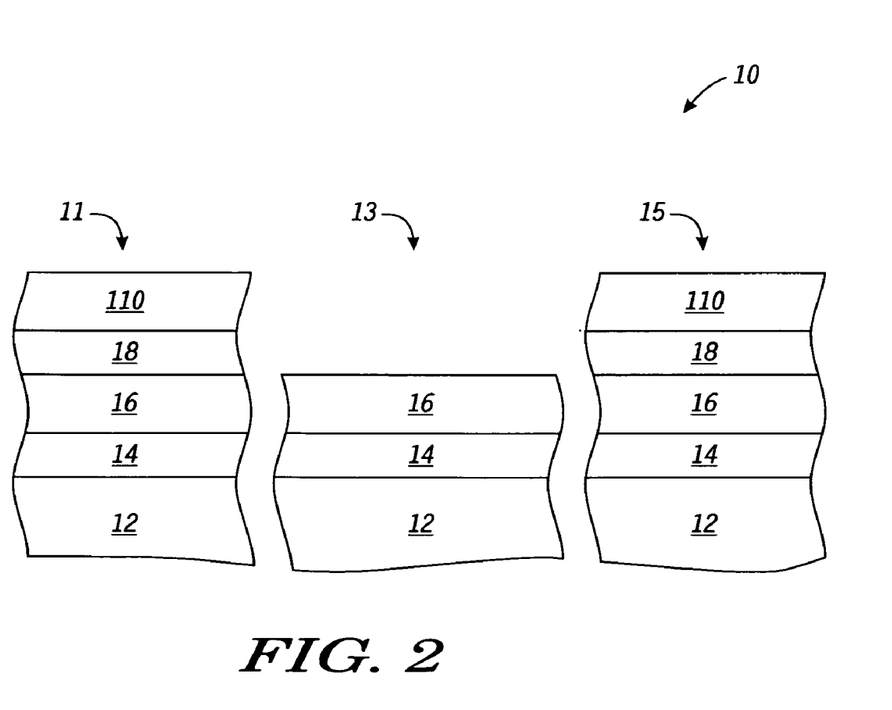
FIG. 2 includes an illustration of a cross-sectional view of the workpiece of FIG. 1 after removing one of the buried insulating layers at the second location.

FIG. 2 includes an illustration of a cross-sectional view of the workpiece 10 of FIG. 1 after removing portions of the semiconductor layer 110 and the insulating layer 18 at the location 13. A masking layer (not illustrated) can be formed over the locations 11 and 15 of the workpiece 10. A conventional or proprietary etch process can be used to remove a portion of the semiconductor layer 110 and the insulating layer 18 at the location 13 to expose a portion of the semiconductor layer 16. In one embodiment, the semiconductor layer 16 can serve as an etch stop for the etch process. The masking layer can be removed using a conventional or proprietary etching or ashing process after the layers 110 and 18 are removed at the location 13.

Figure 3:
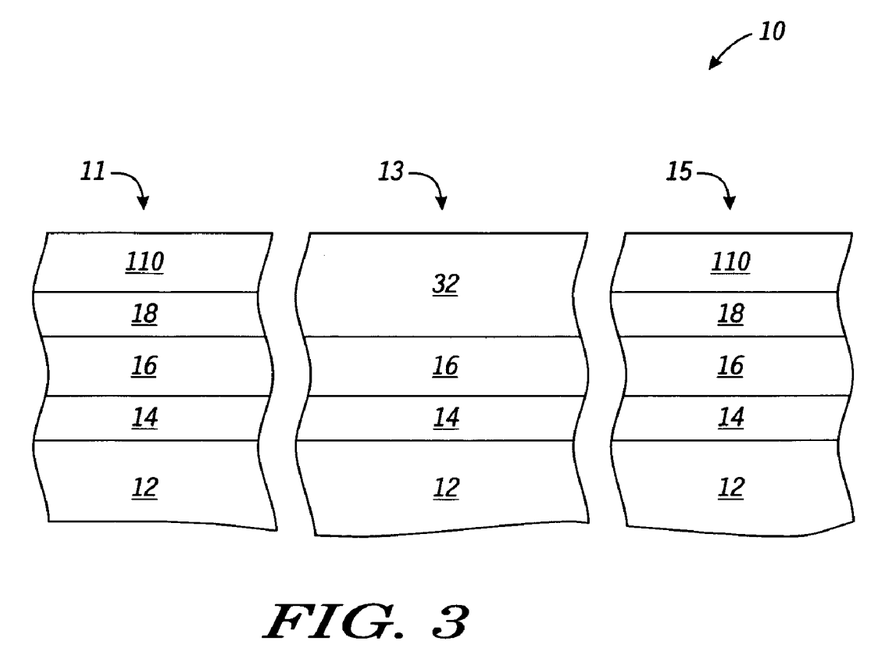
FIG. 3 includes an illustration of a cross-sectional view of the workpiece of FIG. 2 after formation of a semiconductor layer at the second location.

FIG. 3 includes an illustration of a cross-sectional view of the workpiece 10 of FIG. 2 after forming a semiconductor layer 32 over an exposed portion of the semiconductor layer 16. In one embodiment, the semiconductor layer 32 can act as an extension of the semiconductor layer 16 such that the semiconductor layers 16 and 32 can comprise a substantially continuous semiconductor portion. The semiconductor layer 32 can be the same or a different material, the same or a different dopant, the same or a different dopant concentration, the same or a different strain, the same or a different thickness, or any combination thereof as compared to the semiconductor layer 16. The semiconductor layer 32 can be grown or deposited by a conventional or proprietary process. In one embodiment, the semiconductor layer 32 can be epitaxially grown from the surface of the semiconductor layer 16. In another embodiment, the semiconductor layer 32 can be deposited and polished, such that the surface of the semiconductor layer 32 at the location 13 is approximately co-planer with the top surface of the semiconductor layer 110. In one embodiment (not illustrated), one or more additional protective layers may be subsequently formed over the exposed surface of the semiconductor layer 32.

Figure 4:
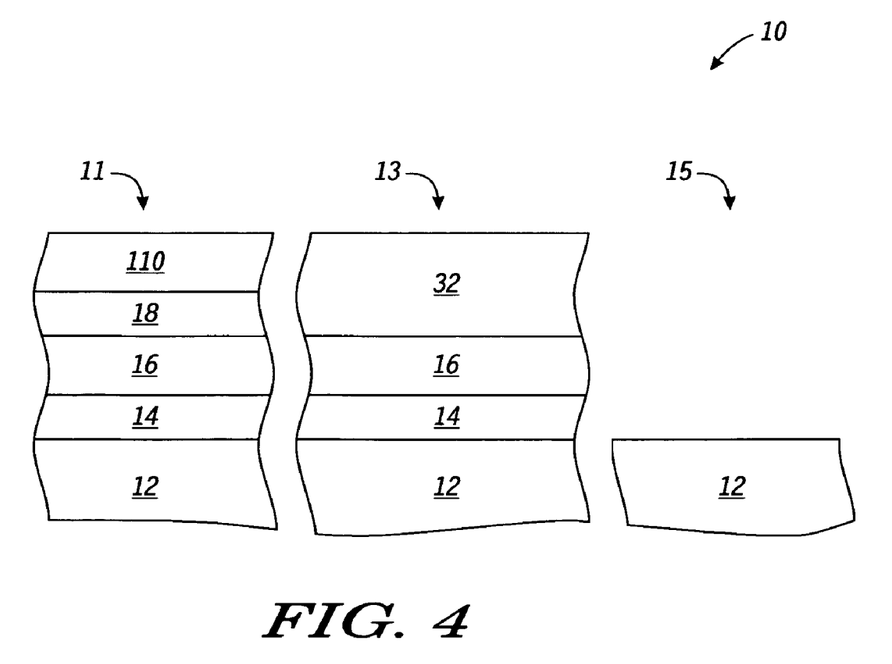
FIG. 4 includes an illustration of a cross-sectional view of the workpiece of FIG. 3 after removal of two buried insulating layers at the third location.

FIG. 4 includes an illustration of a cross-sectional view of the workpiece 10 of FIG. 3 after removing portions of the semiconductor layers 16 and 110 and the insulating layers 14 and 18 at the location 15. A masking layer (not illustrated) can be formed over the locations 11 and 13 of the workpiece 10. A conventional or proprietary etch process can be used to remove a portion of the semiconductor layers 16 and 110 and the insulating layers 14 and 18 at the location 15 to expose a portion of the base layer 12. In one embodiment, the base layer 12 can serve as an etch stop for the etch process. The masking layer can be removed using a conventional or proprietary etching or ashing process after the layers 110, 18, 16, and 14 are removed at the location 15.

Figure 5:
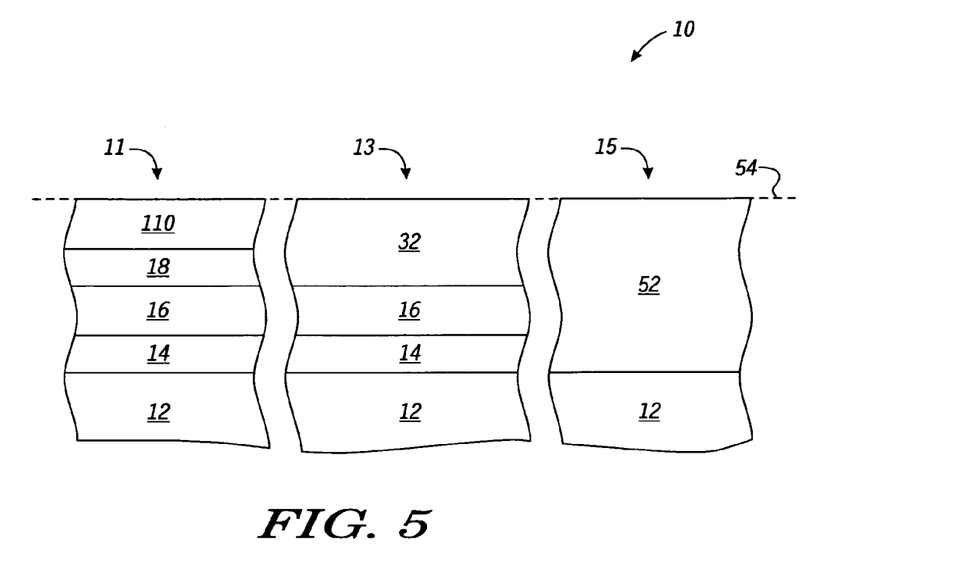
FIG. 5 includes an illustration of a cross-sectional view of the workpiece of FIG. 4 after formation of a semiconductor layer at the third location.

FIG. 5 includes an illustration of a cross-sectional view of the workpiece 10 of FIG. 4 after forming a semiconductor layer 52 over an exposed portion of the base layer 12. The semiconductor layer 52 can be the same or a different material, the same or a different dopant, the same or a different dopant concentration, the same or a different strain, the same or different thickness, or any combination thereof as compared to the semiconductor layer 16. In one embodiment, the semiconductor layer 52 can act as an extension of the base layer 12 such that the base layer 12 and the semiconductor layer 52 can comprise a substantially continuous semiconductor portion. In one embodiment, the base layer 12 and the semiconductor layer 32 can comprise substantially the same material. The semiconductor layer 52 can be grown or deposited by a conventional or proprietary process as described with respect to the semiconductor layer 32. The semiconductor layer 52 can be the same or a different material as compared to the semiconductor layer 32 and can he the same or different material as compared to the semiconductor layer 110. A top surface of the semiconductor layer 52 at the location 15 can be in substantially a same plane 54 with the top surfaces of both the semiconductor layers 110 and 32. In one embodiment (not illustrated), the workpiece 10 can be polished using a chemical mechanical polishing process.

Figure 6:
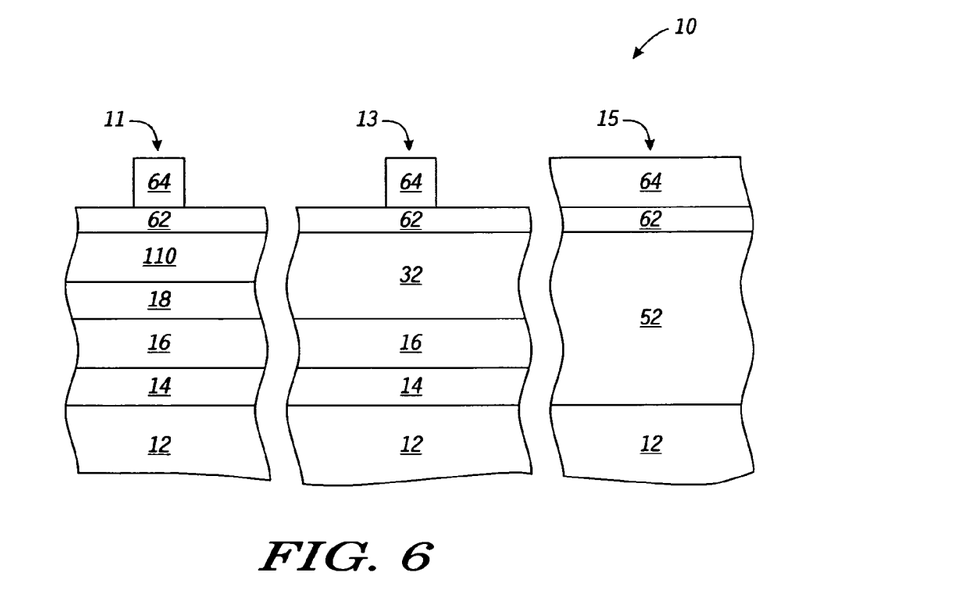
FIG. 6 includes an illustration of a cross-sectional view of the workpiece of FIG. 5 after formation of a patterned layer overlying a protective layer.

FIG. 6 includes an illustration of the workpiece 10 of FIG. 5 after forming a protective layer 62 and a patterned layer 64. The protective layer 62 can be formed overlying the workpiece 10. The protective layer 62 can include an oxide, a nitride, an oxynitride, or any combination thereof. The protective layer 62 can be formed by a conventional or proprietary process and have a thickness in a range of approximately 10 to approximately 100 nm. In a particular embodiment, the protective layer 62 may include a silicon nitride material having a thickness in a range of approximately 10 to approximately 50 nm. The patterned layer 64 can be formed overlying the protective layer 62 by a conventional or proprietary lithographic process. In one embodiment, the patterned layer 64 can include a conventional or proprietary radiation-imageable material (e.g., photoresist, deep-ultraviolet resist, etc.). Before forming the patterned layer 64, both surfaces of the protective layer 62 are substantially parallel to the major surface of the base layer 12. Thus, the top surfaces of the semiconductor layers 110, 32, and 52 lie substantially along the same plane that is substantially parallel to the major surface of the base layer 12. The substantially planar surfaces can help to increase manufacturing margins for lithographic and polishing operations. Thus, in the illustrated embodiment, depth of focus and other issues can be less problematic. After forming the patterned layer 64 in the illustrated embodiment, portions of the protective layer 62 are exposed at the locations 11 and 13, and the protective layer 62 remains covered at the location 15 of the workpiece 10. Though not illustrated, exposed portions of the protective layer 62 can be removed to form a hard mask. The patterned layer 64 can then be removed from the workpiece 10.

Figure 7:
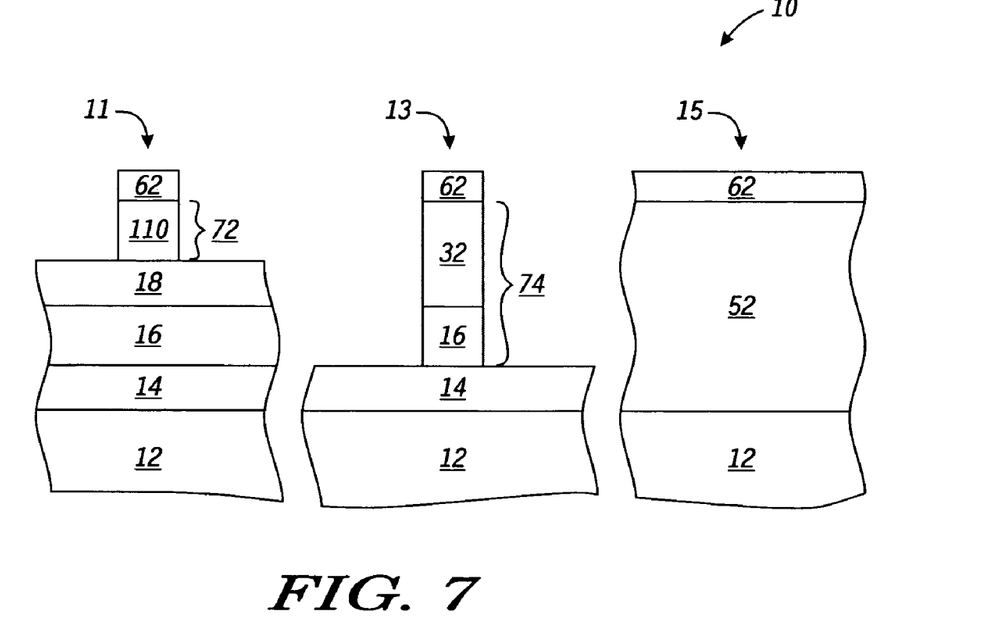
FIG. 7 includes an illustration of a cross-sectional view of the workpiece of FIG. 6 after formation of semiconductor fins at the first and second locations.

FIG. 7 includes an illustration of the workpiece 10 of FIG. 6 after forming the semiconductor fins 72 and 74. Exposed portions of the semiconductor layers 110 and 32 at the locations 11 and 13, respectively, can be removed to form the semiconductor fins 72 and 74, respectively. The semiconductor fin 72 can overlie and be spaced apart from the semiconductor layer 16. The semiconductor fin 74 can overlie and be spaced apart from the base layer 12. The semiconductor fin 74 can comprise portions of the semiconductor layer 16 and the semiconductor layer 32. In one embodiment, the semiconductor layer 16 can include a dopant with an opposite conductive type to that of the semiconductor fin 72. For example, the semiconductor layer 16 can have an n-type dopant and the semiconductor fin 72 can include a p-type dopant region. In another embodiment, the conductivity type of the semiconductor fin 72 can be opposite that of the semiconductor fin 74. In another embodiment, the semiconductor fin 72, the semiconductor fin 74, or any combination thereof can have a doping level of less than approximately 1E14 atoms per cubic centimeter. In a particular embodiment, the semiconductor fin 72, the semiconductor fin 74, or any combination thereof may be substantially undoped. In one embodiment, the insulating layers 14 and 18 can act as etch stop layers for the semiconductor material removal process.

In one embodiment, the portions of the protective layer 62 at the locations 11 and 13 can be removed after forming the semiconductor fins 72 and 74 and before forming another layer over the semiconductor fins 72 and 74. FIGS. 8 to 13 are based on this embodiment. In another embodiment, the portion of protective layer 62 over the semiconductor fins 72 and 74 at the locations 11 and 13 may not be removed at this time.

Figure 8:
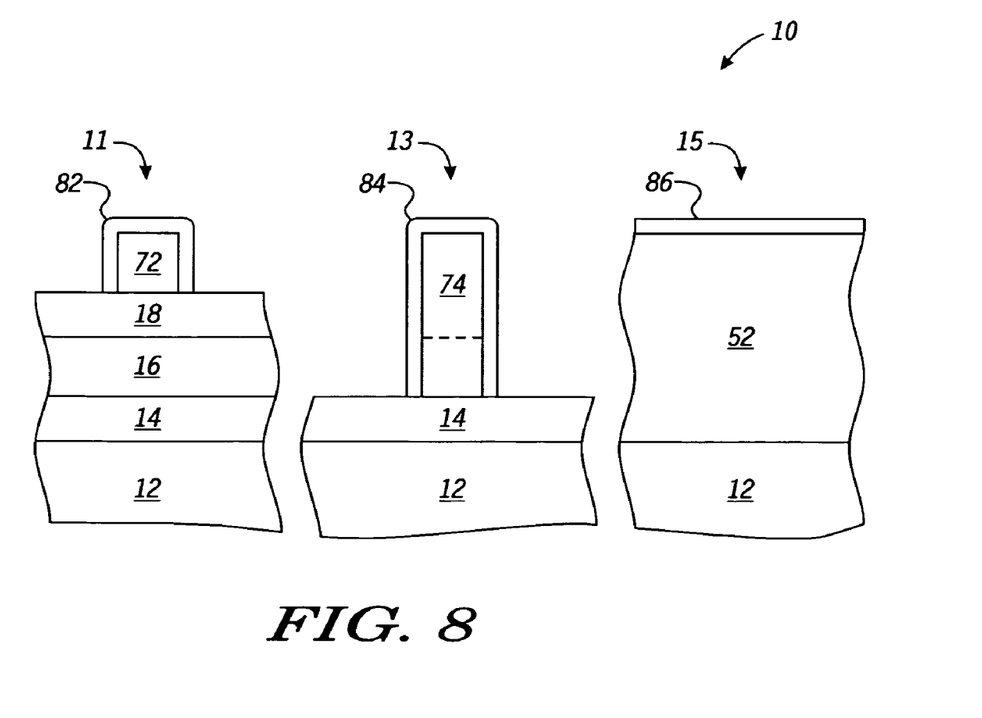
FIG. 8 includes an illustration of a cross-sectional view of the workpiece of FIG. 7 after formation of a dielectric layer.

FIG. 8 includes an illustration of a cross-sectional view of workpiece 10 of FIG. 3 after forming dielectric layers 82, 84, and, 86 at the locations 11, 13, and 15, respectively. In the illustrated embodiment, a portion or each of the dielectric layers 82, 84, and, 86 at the locations 11, 13, and 15 can act as a gate dielectric. The dielectric layer 82 can include a dielectric material such as silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $Zr_aO_b$, other Hf-containing or Zr-containing dielectric material, a doped version of any of the foregoing (lanthanum doped, niobium doped, etc.), or any combination thereof. As used herein, subscripts on compound materials specified with alphabetic subscripts are intended to represent the non-zero fraction of the atomic species present in that compound, and therefore, the alphabetic subscripts within a compound sum to 1. For example, in the case of $Hf_aO_bN_c$, the sum of "a," "b," and "c" is 1. The dielectric layer 82 may be thermally grown using an oxidizing or nitridizing ambient, or deposited using a conventional or proprietary chemical vapor deposition ("CVD") technique, physical vapor deposition ("PVD") technique, atomic layer deposition (ALD) or a combination thereof. The dielectric layer 82 can have a thickness in a range of approximately 1 to approximately 25 nm. In a particular embodiment, the dielectric layer 82 may also serve as a screening layer to help reduce implant channeling during a doping implant process. As compared to the dielectric layer 82, the dielectric layers 84 and 86 can each have the same or different materials, be formed at the same or different times, be formed by a same or different process, have the same or a different thickness, or any combination thereof.

Figure 9:
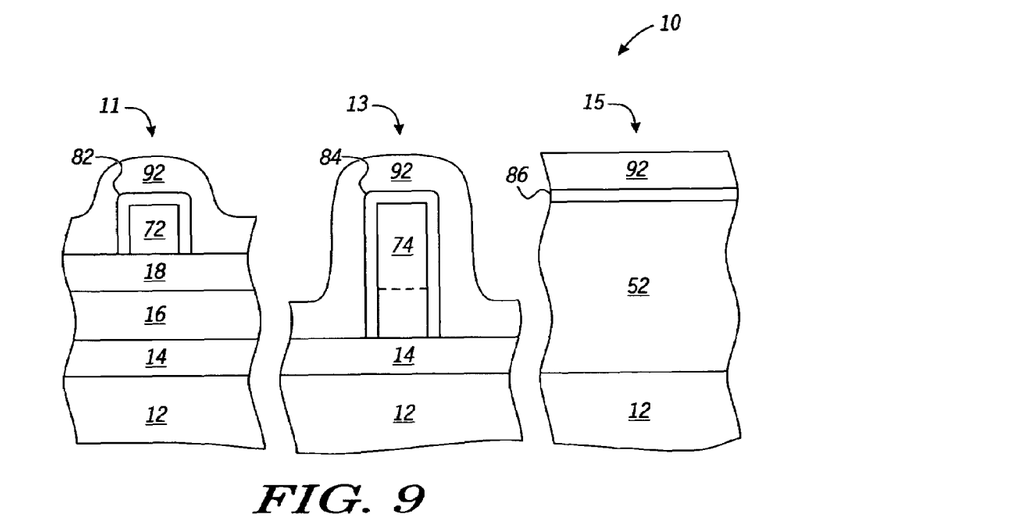
FIG. 9 includes an illustration of a cross-sectional view of the workpiece of FIG. 8 after formation of a conductive layer.

FIG. 9 includes an illustration of a cross-sectional view of the workpiece 10 of FIG. 8 after forming a conductive layer 92. In accordance with one embodiment, the conductive layer 92, suitable for forming gate electrodes, can be formed over the workpiece 10. The conductive layer 92 can include one or more semiconductor-containing or metal-containing materials. In one embodiment, the conductive layer 92 includes polysilicon or amorphous silicon deposited by a chemical vapor deposition process. In another embodiment, the conductive layer 92 may include one or more other materials or may be deposited by one or more other processes. In one particular embodiment, the conductive layer 92 is doped when deposited, and in another particular embodiment, the conductive layer 92 is doped after it is deposited. In one embodiment, the thickness of the conductive layer 92 is in a range of approximately 50 to approximately 500 nm, and in a finished device, remaining portions of the conductive layer have a dopant concentration of at least approximately 1E19 atoms/cm3 when the conductive layer 92 includes polysilicon or amorphous silicon. In one embodiment, the conductive layer 92 can be formed substantially conformal to the exposed surface of the workpiece 10.

The conductive layer 92 may include a single layer or a plurality of layers. When the conductive layer includes the plurality of layers, the bottom layer of the conductive layer 92 can determine the work function of a transistor structure being formed and thus affects the threshold voltage of the transistor. The bottom layer can be a metal carbide such as TaC, or a metal nitride such as TiN, or a silicide such as NiSi, or any other suitable metallic conductor. The rest of the conductive layer may be made of doped polysilicon, a metal silicide or any other suitable conductor. Each of the portions of the conductive layer 92, such as those at the locations 11, 13 and 15, can comprise one or more materials different from the other locations, depending on the intended purpose of the electronic component (e.g., the transistor) at the respective location.

Figure 10:
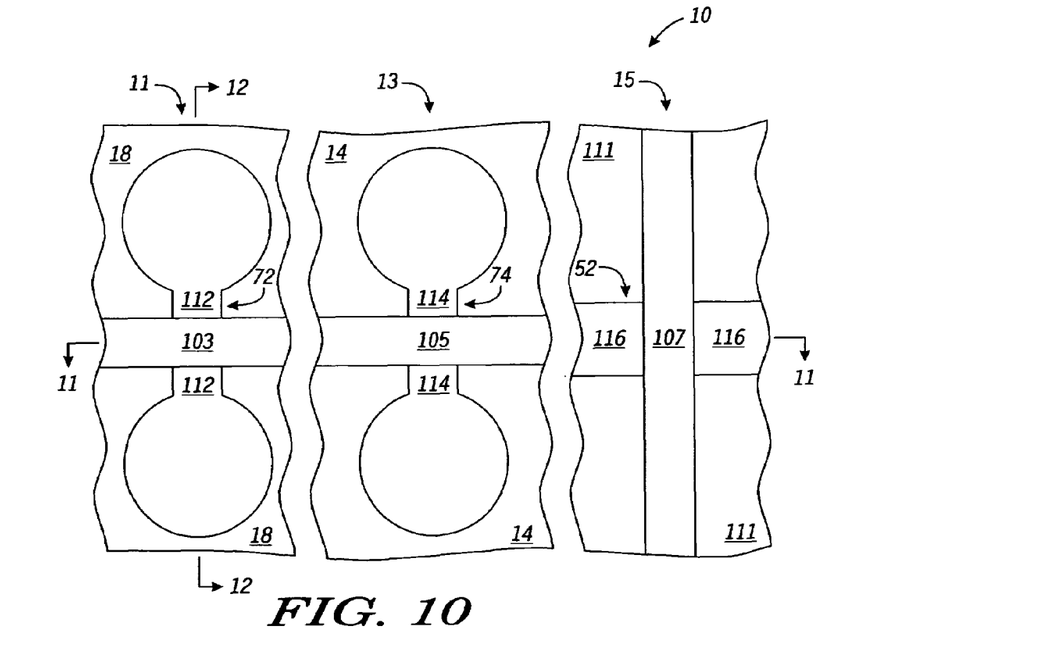
FIG. 10 includes an illustration of a top view of the workpiece of FIG. 9 after formation of conductive members and source/drain regions at each of the three locations.
Figure 11:
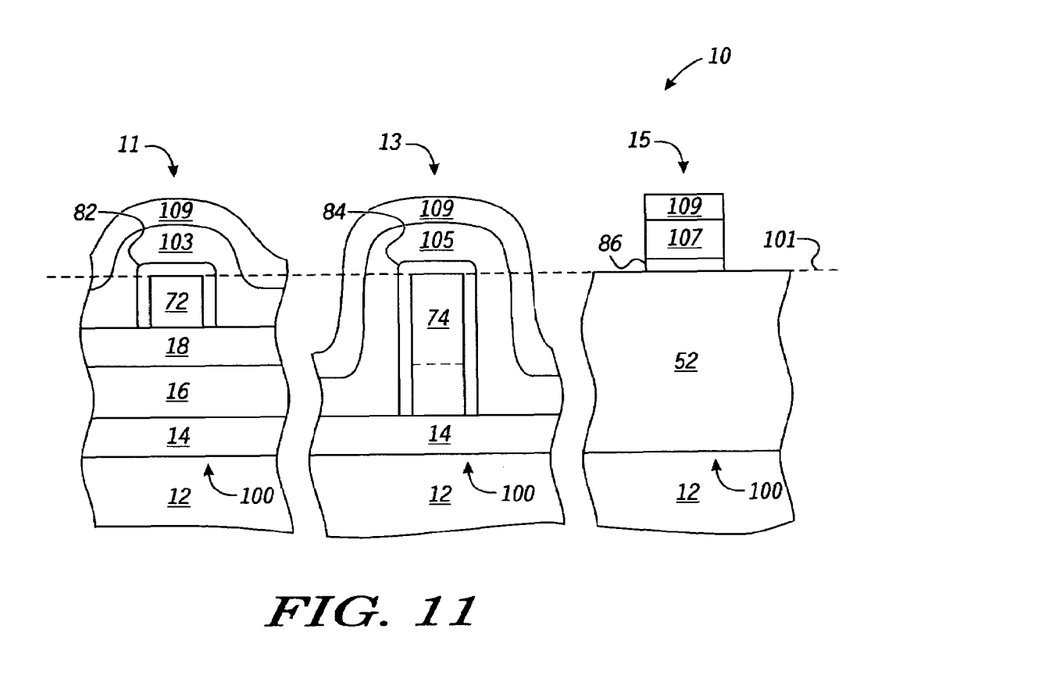
FIG. 11 includes an illustration of a cross-sectional view of the workpiece of FIG. 10 along sectioning line 11-11.
Figure 12:
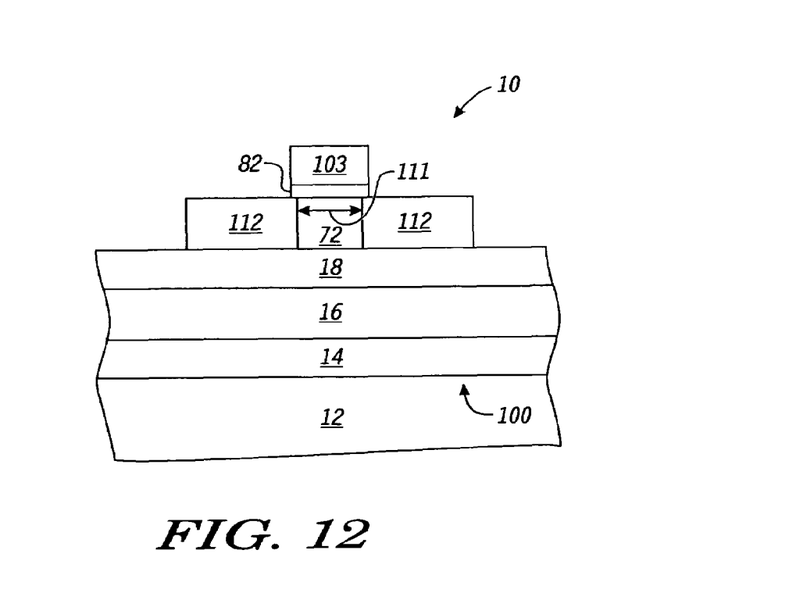
FIG. 12 includes an illustration of a cross-sectional view of the workpiece of FIG. 10 along sectioning line 12-12.

FIG. 10 includes an illustration of a top view of a portion of the workpiece 10 after forming conductive members 103, 105, and 107. FIGS. 11 and 12 include illustrations of cross-sectional views taken at sectioning lines 11-11 and 12-12, respectively, in FIG. 10. For clarity, FIG. 11 is discussed prior to FIG. 10 to better map the feature formation with the process flow for forming the electronic device. FIG. 10 is then discussed to illustrate the relative position of the features with respect to each other. In an embodiment illustrated in FIG. 11, the conductive members 103, 105, and 107 can act as gate electrodes for electronic components at the location 11, 13, and 15, respectively. A patterned layer 109 can be formed over the conductive layer 92 using a conventional or proprietary lithographic process. In one embodiment, patterned layer 109 can be a resist layer.

Exposed portions of conductive layer 92 can be removed to form the conductive members 103, 105, and 107 using a conventional or proprietary etching process. A first fin structure at the location 11 can include the semiconductor fin 72, the dielectric layer 82, and the conductive member 103. A second fin structure at the location 13 can include the semiconductor fin 74, the dielectric layer 84, and the conductive member 105. A planar structure at the location 15 can include the remaining portion of the dielectric layer 86 and the conductive member 107 overlying the semiconductor layer 52. Although not illustrated, the conductive members 103 and 105 can be different conductive members or different portions of a single conductive member. When the conductive members 103 and 105 are separate, electronic components at the locations 11 and 13 may be independently controlled from each other. When the conductive members 103 and 105 are portions of a single conductive member, electronic components at the locations 11 and 13 can be controlled by a same signal.

In the alternative embodiment (not illustrated) in which the remaining portions of the protective layer 62 is not removed before forming the conductive layer 92, the remaining portions of the protective layer 62 can lie between the semiconductor fins 72 and 74 and the conductive layer 92. The remaining portions of the protective layer 62 can help protect the semiconductor fins 72 and 74 during the formation of the conductive members 103 and 105. The remaining portion of the protective layer 62 can affect the inversion of the top surface of the semiconductor fins 72 and 74 during subsequent operation of the electronic device. In a particular embodiment, the remaining portion of the protective layer 62 can mitigate the premature inversion of adjacent corner regions of the semiconductor fins 72 and 74 during subsequent operation. Exposed portions of the protective layer 62 (i.e., the remaining portions of the protective layer 62 that are not covered by conductive members 103 or 105) can subsequently be removed before forming source/drain regions.

Doped regions 112, 114, and 116 within portions of a semiconductor fin 72, a semiconductor fin 74, and a semiconductor layer 52, respectively are illustrated in FIG. 10. The doped regions 112 can be source/drain regions for the transistor structure at the location 11. The doped regions 112 can each be spaced apart from the other, and each be connected to the semiconductor fin 72. Similarly, the doped regions 114 and 116 can be source drain regions for the transistor structures at the location 13 and 15, respectively. Each of the doped regions 114 and each of the doped regions 116 can each be spaced apart from the other. The doped regions 114 can each be connected to the second semiconductor fin 74, and the doped regions 116 can each be connected to the semiconductor layer 52.

The doped regions 112, 114, and 116 can be formed using a conventional or proprietary doping process. The doped regions 112, 114, and 116 can include the same or a different dopant, the same or a different dopant concentration, the same or a different junction profile, or any combination thereof. With respect to the semiconductor fin 72 in FIG. 12, a channel region is a portion of the semiconductor fin 72 lying under the conductive member 103 and between the doped regions 112. With respect to the semiconductor fin 74, a channel region is a portion of the semiconductor fin 74 lying under the conductive member 105 and between the doped regions 114. With respect to the semiconductor layer 52, a channel region is a portion of the semiconductor layer 52 lying under the conductive member 107 and between the doped regions 116. In the illustrated embodiment, a first transistor structure can include the semiconductor fin 72, the dielectric layer 82, and the conductive member 103. A second transistor structure can include the second semiconductor fin 74, the dielectric layer 84, and the conductive member 105, and a third transistor structure can include the semiconductor layer 52, the dielectric layer 86, and the conductive member 107.

In one embodiment, the channel regions may have dopant types and concentrations substantially the same as the corresponding semiconductor layer from which it is formed. Each of the channel regions at the locations 11, 13, or 15 can be n-type doped or p-type doped. In one embodiment, the channel region at the location 11 is a p-doped region and the channel region at the location 13 is an n-doped region. As illustrated in FIG. 12, the channel region at the location 11 can be configured such that when the transistor is on, charge carriers would flow through the channel region along a direction illustrated by a double-headed arrow 111. Although double-headed arrow 111 is used, the electronic device can be configured such that the current flow substantially flows in only one of the directions or may flow substantially in one direction under a set of biasing conditions and flow in the other direction under a different set of biasing conditions. Current flows within the channel region in a direction substantially parallel to a primary surface 100 of the base layer 12. Although not illustrated, the direction the current would flow within the channel region at the location 13 would also be along direction substantially parallel to the primary surface 100 of the base layer 12.

Again referring to FIG. 11, the top surfaces of the semiconductor fins 72 and 74, and the semiconductor layer 52 can substantially lie along a plane 101, the plane 101 substantially parallel to a major surface 100 of the base layer 12. In one embodiment, a line segment connecting a top surface of the semiconductor fin 72 and the semiconductor fin 74 can be substantially parallel to the major surface 100 of the base layer 12. In one embodiment, the height of the semiconductor fin 72 has the same value as the thickness of the semiconductor layer 110 (in FIG. 1).

Figure 13:
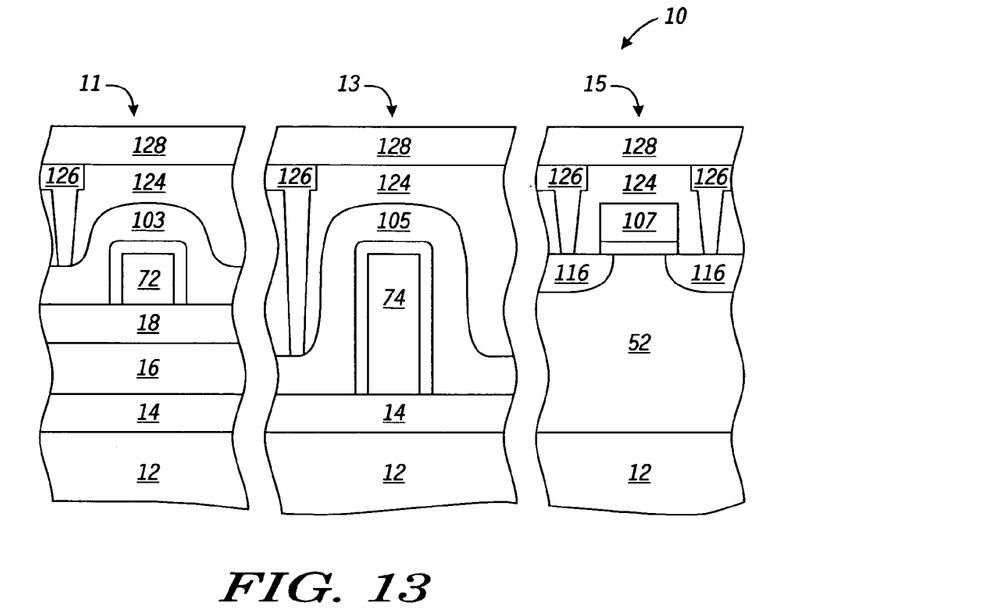
FIG. 13 includes an illustration of a cross-sectional view of a substantially complete electronic device.

FIG. 13 includes an illustration of a cross-sectional view of a substantially completed electronic device. One or more insulating layers 124, one or more conductive layers 126, and one or more encapsulating layers 128 are formed using one or more conventional or proprietary techniques. The transistors formed may be designed as fully or partly depleted transistors.

Figure 14:
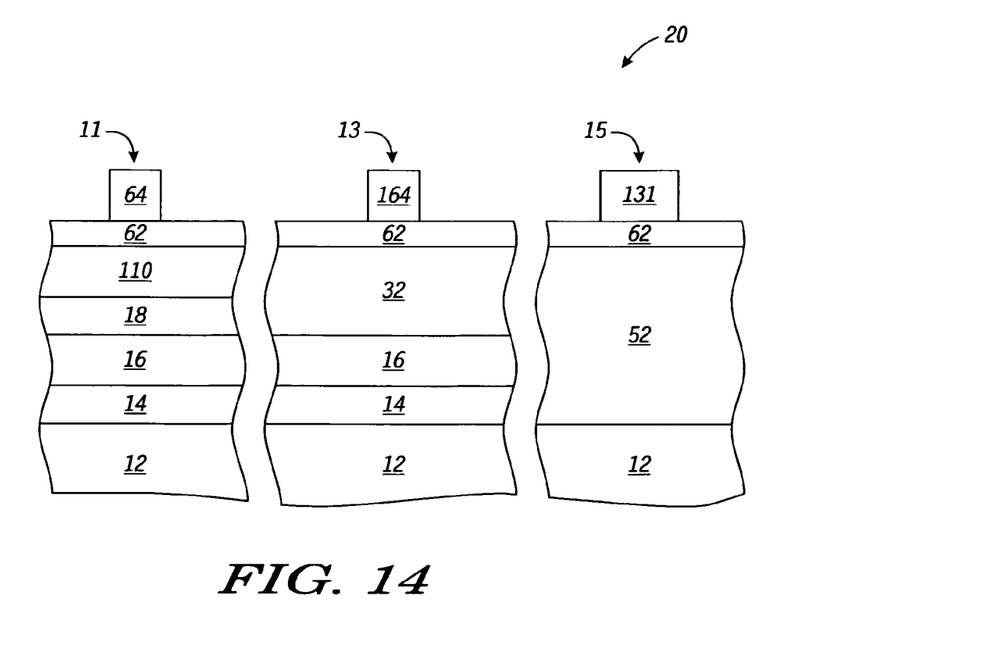
FIG. 14 includes an illustration of a cross-sectional view of the workpiece of FIG. 7 according to an alternative embodiment.

FIG. 14 includes an illustration of the workpiece 20 according to an alternative embodiment. Processing proceeds as previously described for FIGS. 1 through 5 for the workpiece 10. At the locations 11 and 13 processing proceeds as previously described for FIG. 6. At the location 15, the patterned layer 64 is patterned to form a portion 131. The portion 131 can be similar to other portions of the patterned layer 64, such as those illustrated at the locations 11 and 13. The protective layer 62 at the location 15 can be formed as described in an embodiment for forming the protective layer 62 at the locations 11 and 13 such that the portion of the protective layer 62 at the location 15 can act as a portion of a mask and help form a semiconductor fin at the location 15.

Figure 15:
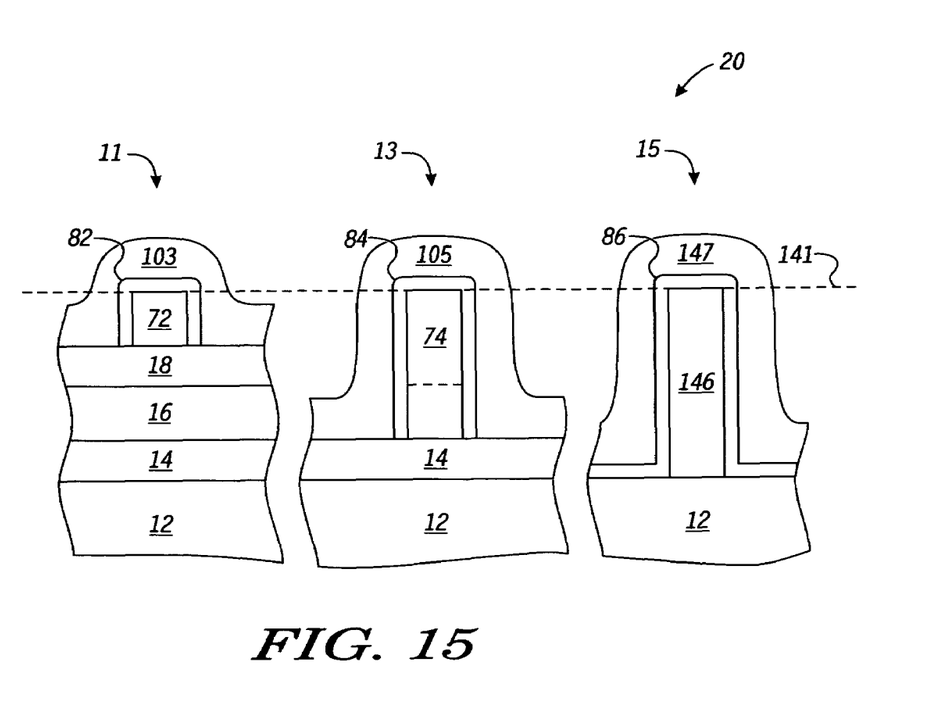
FIG. 15 includes an illustration of a cross-sectional view of the workpiece of FIG. 11 according to the alternative embodiment.

FIG. 15 includes an illustration of the workpiece 20 after formation of the conductive member 147. Processing proceeds as previously described for the locations 11 and 13 for the workpiece 10, except that the semiconductor fin 146 is formed at the location 15 rather then a planar transistor. In one embodiment, exposed portions of the semiconductor layer 52 can be removed using a timed process. Although the semiconductor fin 146 is illustrated with a base along the surface of the base layer 12, in other embodiments, the surface from which the semiconductor fin extends can be at a different elevation.

The remainder of the protective layer 62 may or may not be removed, as previously described for the workpiece 10, after forming the semiconductor fin 146 and before forming a dielectric layer adjacent to the semiconductor fin 146. FIG. 15 illustrates an embodiment in which the remainder of the protective layer 62 is removed after forming the semiconductor fin 146 and forming the dielectric layer. The dielectric layer 86 can be formed as previously described, although it can lie along the surface of the semiconductor fin 146. A portion of the dielectric layer 86 can overlie exposed portions of the base layer 12. Such a portion can electrically insulate the base layer 12 from subsequently formed, overlying conductive members, and can act as an etch stop layer during subsequent separation of the conductive layer 92 into individual conductive members. Conductive layer 92 can be formed as previously described in reference to FIG. 9 and the workpiece 10. At the location 15, a conductive member 147 can be formed by an embodiment previously described for the conductive members 103 and 105. The semiconductor fin 146, the dielectric layer 86 and the conductive member 147 can comprise a third fin structure at the location 15. In the illustrated embodiment, the top surface of the semiconductor fins 72, 74, and 147 can substantially lie in a plane 141, the plane 141 substantially parallel to a major surface of the substrate. Processing can proceed as previously described for the workpiece 10 to form a substantially complete electronic device.

Many different aspects and embodiments are possible. Some of those aspects and embodiments are described below. After reading this specification, skilled artisans will appreciate that those aspects and embodiments are only illustrative and do not limit the scope of the present invention.

In a first aspect an electronic device can include a base layer, and a first semiconductor layer overlying and spaced apart from the base layer. The electronic device can also include a first semiconductor fin overlying and spaced apart from the first semiconductor layer, and a second semiconductor fin overlying and spaced apart from the base layer, wherein the second semiconductor fin includes a portion of the first semiconductor layer.

In one embodiment of the first aspect, a first dimension is a thickness of the first semiconductor layer, and a second dimension is a height for the first semiconductor fin. A third dimension is a shortest distance the first semiconductor fin is spaced apart from the first semiconductor layer, and a fourth dimension is a height of the second semiconductor fin, wherein the fourth dimension is substantially equal to the sum of the first, second, and third dimensions. In another embodiment, the electronic device includes a transistor including a gate electrode including portions that lie adjacent to opposing sides of the first semiconductor fin. The electronic device can also include a first source/drain region, and a second source/drain region spaced apart from the first source/drain region. The electronic device can also include a channel region lying within the first semiconductor fin and between the first source/drain region and the second source/drain region, wherein the channel region is configured, such that when the transistor would be on, charge carriers would flow through the channel region in a direction substantially parallel to a primary surface of the base layer.

In another embodiment of the first aspect, a top surface of the first semiconductor fin and a top surface of the second semiconductor fin lie along substantially a same plane, the same plane being substantially parallel to a major surface of the substrate. In still another embodiment, the electronic device further includes a first insulating layer lying between the base layer and the first semiconductor layer, and a second insulating layer lying between the first semiconductor layer and the first semiconductor fin. In a particular embodiment, the first insulating layer lies between the base layer and the second semiconductor fin.

In a second aspect, an electronic device can include a base layer, a first semiconductor layer overlying and spaced apart from the base layer, and a first semiconductor fin overlying and spaced apart from the first semiconductor layer.

In one embodiment of the second aspect, the first semiconductor layer includes a substantially same semiconductor material as the first semiconductor fin. In another embodiment, the first semiconductor layer includes a different semiconductor material from the first semiconductor fin. In a particular embodiment, the electronic device can further include a second semiconductor fin overlying the base layer and having an opposite conductivity type compared to the first semiconductor fin, wherein the second fin includes a portion of the first semiconductor layer.

In a more particular embodiment of the second aspect, a line segment extending from a top surface of the first semiconductor fin to a top surface of the second semiconductor fin is substantially parallel to a major surface of the base material. In another more particular embodiment, the first semiconductor fin includes a first channel region of a first transistor structure, and the second semiconductor fin includes a second channel region of a second transistor structure. In another particular embodiment, the first semiconductor layer and the first semiconductor fin have different crystal orientations along a same direction.

In another embodiment of the second aspect, the electronic device can further include a first insulating layer lying between the base layer and the first semiconductor layer, and a second insulating layer lying between the first semiconductor layer and the first semiconductor fin. In a particular embodiment, the electronic device includes a transistor including a gate electrode including portions that lie adjacent to opposing sides of the first semiconductor fin. The electronic device can also include a first source/drain region, and a second source/drain region spaced apart from the first source/drain region. The electronic device can also include a channel region lying within the first semiconductor fin and between the first source/drain region and the second source/drain region, wherein the channel region is configured, such that when the transistor would be on, charge carriers would flow through the channel region in a direction substantially parallel to a primary surface of the base layer.

In a third aspect, a process for forming an electronic device can include providing a workpiece that can include a base layer, a first semiconductor layer that overlies and is spaced apart from the base layer, a second semiconductor layer that overlies and is spaced apart from the first semiconductor layer, and an insulating layer Lying between the first semiconductor layer and the second semiconductor layer. The process can also include removing a portion of the second semiconductor layer to form a first semiconductor fin, and forming a conductive member overlying the first semiconductor fin.

In one embodiment of the third aspect, the process can further include forming an opening in the insulating layer extending to the first semiconductor layer, wherein the insulating layer lies between the first and second semiconductor layers. The process can also include epitaxially growing a third semiconductor layer from the first semiconductor layer after forming the opening. In a particular embodiment, the process can further include polishing an exposed surface of the third semiconductor layer, such that after polishing, top surfaces of the second and third semiconductor layers lie substantially along a same plane. In a more particular embodiment, removing the portion of the second semiconductor layer includes removing portions of the first and third semiconductor layers to form a second semiconductor fin that includes portions of the first and third semiconductor layers.

In another embodiment of the third aspect, the process can further include forming a first source/drain region and a second source/drain region spaced apart from the first source/drain region. A channel region can lie within the first semiconductor fin. The channel region can be configured, such that when the transistor would be on, charge carriers would flow through the channel region in a direction substantially parallel to a primary surface of the base layer. Forming the conductive member can include forming a gate electrode having portions that lie adjacent to opposing sides of the first semiconductor fin.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Doping and activation of various active legions can be accomplished at different locations within the process flow. For example, a channel region may be doped prior to or after formation of a semiconductor fin. With a fin structure, doping within a channel region can occur after formation of a conductive member. In a similar manner, anneal or activation processes can be accomplished either as a stand alone process or combined with another high temperature process such as an oxidation or nitridation.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any sub-combination. Further, reference to values stated in ranges includes each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process for forming an electronic device comprising:
providing a workpiece including a base layer, a first semiconductor layer that overlies and is spaced apart from the base layer, a second semiconductor layer, and an insulating layer lying between the first semiconductor layer and the second semiconductor layer;
forming a first opening in the insulating layer extending to the first semiconductor layer, wherein the insulating layer lies between the first and second semiconductor layers;
epitaxially growing a third semiconductor layer from the first semiconductor layer after forming the first opening;
removing a portion of the second semiconductor layer to form a first semiconductor fin that overlies and is spaced apart from the first semiconductor layer, and removing a portion of the third semiconductor layer to form a second semiconductor fin that is spaced apart from the first semiconductor fin, wherein:

before removing the portion of the second semiconductor layer and removing the portion of the third semiconductor layer, top surfaces of the second and third semiconductor layers lie along a same plane; and removing the portion of the second semiconductor layer and removing the portion of the third semiconductor layer are performed substantially simultaneously during at least one point in time;

forming a first gate electrode overlying the first semiconductor fin; and doping portions of the first semiconductor fin to form first source/drain regions entirely within the first semiconductor fin, wherein a first transistor includes the first semiconductor fin, the first gate electrode, and the first source/drain regions.

2. The process of claim 1, further comprising polishing an exposed surface of the third semiconductor layer, such that after polishing, top surfaces of the second and third semiconductor layers lie substantially along a same plane.

3. The process of claim 2, wherein removing the portion of the second semiconductor layer comprises removing portions of the first and third semiconductor layers to form a third semiconductor fin that includes portions of the first and third semiconductor layers.

4. The process of claim 3, further comprising:
forming a second gate electrode overlying the third semiconductor fin; and
doping portions of the third semiconductor fin to form second source/drain regions entirely within the third semiconductor layer, wherein a second transistor includes the third semiconductor fin, the second gate electrode, and the second source/drain regions.

5. The process of claim 1, further comprising forming a first source/drain region and a second source/drain region spaced apart from the first source/drain region, wherein:
a channel region lies within the first semiconductor fin;
the channel region is configured, such that when the transistor would be on, charge carriers would flow through the channel region in a direction substantially parallel to a primary surface of the base layer; and
forming the first gate electrode includes forming a first gate electrode having portions that lie adjacent to opposing sides of the first semiconductor fin.

6. The process of claim 1, further comprising forming a second transistor, wherein:
the second transistor is a planar transistor and includes a channel region; and
top surfaces of the first semiconductor fin and the channel region of the second transistor lie substantially along a same plane.

7. The process of claim 1, further comprising:
forming a second gate electrode overlying the second semiconductor fin; and
doping portions of the second semiconductor fin to form second source/drain regions, wherein a second transistor includes the second semiconductor fin, the second gate electrode, and the second source/drain regions.

8. The process of claim 7, wherein the second semiconductor layer and the third semiconductor layer have different crystal orientations.

9. The process of claim 7, wherein the second semiconductor layer and the third semiconductor layer have different strains.

10. The process of claim 9, wherein the second semiconductor layer and the third semiconductor layer have different compositions of semiconductor elements.

11. The process of claim 7, wherein:
removing the portion of the second semiconductor layer exposes a portion of the insulating layer; and
the process further comprises removing a portion of the first semiconductor layer to expose a portion of another insulating layer that lies between the base layer and the first semiconductor layer, wherein the second semiconductor fin includes parts of the first and third semiconductor layers.

12. The process of claim 11, wherein forming the first gate electrode and forming the second gate electrode comprises:
forming a conductive layer over the first semiconductor fin and the second semiconductor fin, wherein after forming the conductive layer, a thickness of the conductive layer is less than each of a height of the first semiconductor fin and a height of the second semiconductor fin; and
etching the conductive layer to form the first gate electrode for the first transistor and the second gate electrode for the second transistor.

13. The process of claim 12, wherein doping the portions of the second semiconductor fin to form the second source/drain regions is performed such that the second source/drain regions lie entirely within the second semiconductor fin.

14. The process of claim 13, further comprising
forming a second opening in the insulating layer and first semiconductor layer extending to the base layer;
epitaxially growing a fourth semiconductor layer from the base layer after forming the second opening;
forming a third gate electrode over the fourth semiconductor layer; and
doping portions of the fourth semiconductor layer to form third source/drain regions entirely within the fourth semiconductor layer, wherein a third transistor includes the third gate electrode and the third source/drain regions.

15. The process of claim 14, wherein the third transistor is a planar transistor, and doping portions of the fourth semiconductor layer are performed such that the third source/drain regions lie entirely within the fourth semiconductor layer.

16. The process of claim 14, further comprising removing a portion of the fourth semiconductor layer to form a third semiconductor fin that overlies the base semiconductor layer; wherein doping portions of the fourth semiconductor layer is performed such that the third source/drain regions lie entirely within the third semiconductor fin.

17. A process for forming an electronic device comprising:
providing a workpiece including a base layer, a first semiconductor layer that overlies and is spaced apart from the base layer, a second semiconductor layer, and an insulating layer lying between the first semiconductor layer and the second semiconductor layer;
removing a portion of the second semiconductor layer to form a first semiconductor fin that overlies and is spaced apart from the first semiconductor layer;
forming a first opening in the insulating layer extending to the first semiconductor layer, wherein the insulating layer lies between the first and second semiconductor layers;
epitaxially growing a third semiconductor layer from the first semiconductor layer after forming the first opening;
removing a portion of the third semiconductor layer to form a second semiconductor fin that is spaced apart from the first semiconductor fin;
forming a second opening in the insulating layer and the first semiconductor layer extending to the base layer;
epitaxially growing a fourth semiconductor layer from the base layer after forming the second opening;

forming a first gate electrode overlying the first semiconductor fin;

forming a second gate electrode overlying the second semiconductor fin;

forming a third gate electrode over the fourth semiconductor layer;

doping portions of the first semiconductor fin to form first source/drain regions entirely within the first semiconductor fin, wherein a first transistor includes the first semiconductor fin, the first gate electrode, and the first source/drain regions;

doping portions of the second semiconductor fin to form second source/drain regions entirely within the third semiconductor layer, wherein a second transistor includes the second semiconductor fin, the second gate electrode, and the second source/drain regions; and doping portions of the fourth semiconductor layer to form third source/drain regions entirely within the fourth semiconductor layer; wherein a third transistor includes the third gate electrode and the third source/drain regions.

18. The process of claim 17, wherein the second transistor is a planar transistor.

19. The process of claim 17, further comprising removing a portion of the fourth semiconductor layer to form a third semiconductor fin that overlies the base semiconductor layer.

* * * * *